US010872795B2

(12) United States Patent
Fuller et al.

(10) Patent No.: US 10,872,795 B2
(45) Date of Patent: Dec. 22, 2020

(54) SUBSTRATE CUSHION BRACE RETAINER

(71) Applicants: ENTEGRIS, Inc., Billerica, MA (US); Matthew A. Fuller, Colorado Springs, CO (US); Colton J. Harr, Colorado Springs, CO (US)

(72) Inventors: Matthew A. Fuller, Colorado Springs, CO (US); Colton J. Harr, Colorado Springs, CO (US)

(73) Assignee: ENTEGRIS, INC., Billerica, MA (US)

( * ) Notice: Subject to any disclaimer, the term of this patent is extended or adjusted under 35 U.S.C. 154(b) by 238 days.

(21) Appl. No.: 16/074,850

(22) PCT Filed: Feb. 3, 2017

(86) PCT No.: PCT/US2017/016534
§ 371 (c)(1),
(2) Date: Aug. 2, 2018

(87) PCT Pub. No.: WO2017/136743
PCT Pub. Date: Aug. 10, 2017

(65) Prior Publication Data
US 2020/0168492 A1 May 28, 2020

Related U.S. Application Data

(60) Provisional application No. 62/292,055, filed on Feb. 5, 2016.

(51) Int. Cl.
*H01L 21/673* (2006.01)
(52) U.S. Cl.
CPC .. *H01L 21/67369* (2013.01); *H01L 21/67379* (2013.01); *H01L 21/67383* (2013.01); *H01L 21/67373* (2013.01)

(58) Field of Classification Search
CPC ........ H01L 21/67369; H01L 21/67379; H01L 21/67383; H01L 21/67373
(Continued)

(56) References Cited

U.S. PATENT DOCUMENTS

H1762 H * 12/1998 Kaempf .................... 206/710
6,267,245 B1   7/2001 Bores et al.
(Continued)

FOREIGN PATENT DOCUMENTS

JP    2005-320028    11/2005
JP    2006120851     5/2006
(Continued)

OTHER PUBLICATIONS

Entegris SB300 FOSB User Manuel; 2013.

*Primary Examiner* — Chun Hoi Cheung
(74) *Attorney, Agent, or Firm* — Entegris, Inc.

(57) ABSTRACT

A substrate retainer (110) is provided which presents a substantially uniform contact face (128) that can accommodate a large variation in the location of substrate registration thereon. The uniform contact face (128) is allowed to deflect and compress in order to eliminates the prospect of substrates (114) being damaged by or becoming inadvertently pinched within the substrate retainer (110) or from being pressed too hard by the uniform contact face (128). With this arrangement, no adhesives or tapes are utilized, so there is no attendant out gassing of volatile organic compounds to contaminate the microenvironment, or complications due to incompatibility of such adhesives and tapes with washing processes.

19 Claims, 10 Drawing Sheets

(58) Field of Classification Search
USPC .......................................... 206/710–712, 832
See application file for complete search history.

(56) References Cited

U.S. PATENT DOCUMENTS

| | | | |
|---|---|---|---|
| 6,273,261 B1 * | 8/2001 | Hosoi | H01L 21/67294 206/459.5 |
| 6,591,987 B2 * | 7/2003 | Wu | H01L 21/67369 206/445 |
| 6,951,284 B2 | 10/2005 | Cheesman et al. | |
| 7,073,999 B2 * | 7/2006 | Oyama | H01L 21/67369 206/454 |
| 7,344,031 B2 * | 3/2008 | Hasegawa | H01L 21/67369 206/710 |
| 7,926,663 B2 * | 4/2011 | Hosoi | H01L 21/67379 206/710 |
| 8,356,713 B2 | 1/2013 | Ogawa | |
| 9,633,877 B2 * | 4/2017 | Gregerson | H01L 21/67383 |
| 2010/0258475 A1 | 10/2010 | Ogawa | |
| 2013/0299384 A1 | 11/2013 | Fuller | |
| 2014/0197068 A1 * | 7/2014 | Cho | H01L 21/67383 206/711 |
| 2015/0083639 A1 | 3/2015 | Gregerson | |

FOREIGN PATENT DOCUMENTS

| | | |
|---|---|---|
| JP | 2015-162476 | 9/2015 |
| KR | 10-2011-0046035 | 5/2011 |
| TW | 200711026 A | 3/2007 |

* cited by examiner

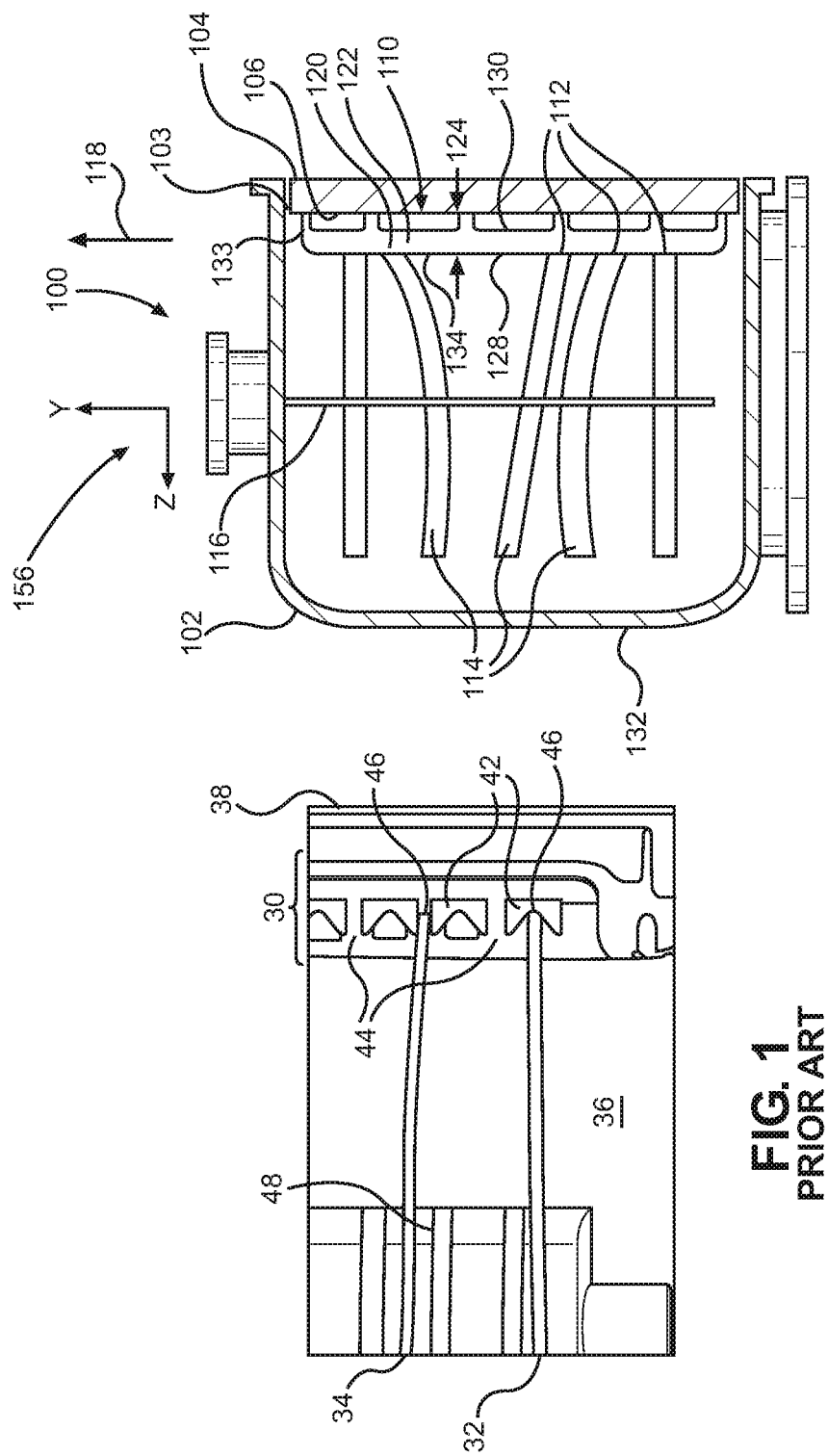

SUBSTRATE CUSHION BRACE RETAINER

CROSS REFERENCE TO RELATED APPLICATIONS

This application claims the benefit of U.S. Provisional Application No. 62/292,055, which was filed on Feb. 5, 2016 and titled "Cushion Retainer for Substrate Container". The entire content of this application is incorporated herein by reference.

TECHNICAL FIELD

The disclosure relates generally to retention of substrates in a substrate container, and more specifically to a cushion retainer for a substrate container.

BACKGROUND

Front opening unified pods (FOUPs) are containers used for storing and transporting wafers and other disk shaped substrates. Many conventional FOUPs utilize a molded polymeric retainer that includes a plurality of cantilever or bridge like structures to flex against the substrate edge to provide a retention force and cushioning function. The retainer is located on the inside face of the FOUP door so that the cantilever or bridge like structures face and contact the substrate edge when the door is installed.

However, substrates have been known to become lodged and pinched between the cantilever or bridge-like structures of conventional retainers. The pinching of the substrates can damage the peripheral portions near the edges of the substrate and can cause failure of the retainer to provide the desired cushioning function. In addition, the pinching of the substrates can cause the substrates to become dislodged from the container upon removal of the door, which can cause damage not only to the pinched substrate but to other substrates housed within the container. Such unintended dislodgement of substrates from the container can also cause general disruption and contamination risk to manufacturing processes.

Substrates are now being manufactured in increasingly larger sizes. In addition, there is a trend in the semiconductor industry toward implementing substrates of decreasing thickness. Accordingly, some substrates have a tendency to warp from the effect of layered processes. The randomness of the warping magnitude and direction, in combination with sag due to gravitational forces, can cause front edges of the substrates to register against the retainer outside allowable tolerances, causing a misalignment of the substrates to the cantilever or bridge like structures of the retainer.

Referring to FIG. 1, a conventional substrate retainer 30 engaged with a planar substrate 32 and a non-planar substrate 34 within a front opening unified pod (FOUP) 36 is depicted. The conventional substrate retainer 30 is mounted to a door 38 of the FOUP 36 and includes substrate engagement portions 42 suspended on cantilever or bridge like structures 44. The intended function of the substrate retainer 30 is to flex against front or leading edges 46 of the substrates 32, 34 to provide a retention force and cushioning to the substrates 32, 34. The planar substrate 32 seats within wafer engagement portion 42 in accordance with the intended design. However, the non-planar substrate 34 is depicted as lodged between adjacent substrate engagement portions 42. In such a scenario, the conventional substrate retainer 30 can damage the non-planar substrate 34. In addition, the non-planar substrate 34 can become pinched between adjacent substrate engagement portions 42, so that when the door 38 and conventional substrate retainer 30 are removed from the FOUP 36, the non-planar wafer 34 is dislodged from a wafer shelf 48 of the FOUP 36 in an unintended and unpredictable manner. Such dislodging of the non-planar wafer 34 can damage not only the non-planar wafer 34, but other wafers housed within the FOUP 36, and can also cause general disruption and contamination risk to manufacturing processes. The misalignment can cause failure of the retainer to provide the desired cushioning function to the substrates.

Other arrangements have been suggested. For example, in one arrangement a retainer with a solid compressible support unit mounted to a back face of a solid cover body has been proposed. However, such an arrangement does limits the amount the compressible support unit can deflect and therefore provides too much pressure to the planar substrates, thus potentially causing damage. As can be seen from the above discussion, there exists a need in the art for a retainer that remedies these issues. A number of embodiments for addressing these concerns are discussed below.

SUMMARY

The present disclosure relates generally to substrate retainers that present a substantially uniform contact face that can accommodate a large variation in the location of substrate registration thereon. The uniform contact face eliminates the prospect of substrates being damaged by or becoming inadvertently pinched within the substrate retainer. In addition, the substrate retainers have a retainer cushion and a mounting structure configured to secure the retainer cushion at the outer peripheral portion of the cushion and to allow a central region of the cushion to deflect relative to the mounting structure. In operation, the substrates are placed in a substrate container and are retained by pressing the central region of the retainer cushion against the substrates while allowing the central region to compress and deflect so as not to damage the substrates. Furthermore, no adhesives or tape are utilized in the disclosed embodiments, so there is no attendant out gassing of volatile organic compounds to contaminate the microenvironment, or complications due to incompatibility of such adhesives and tapes with washing processes.

In some embodiments, a drop-in replacement substrate retainer to support a consumable foam, rubber, or elastomer insert is disclosed. The substrate retainers of the present disclosure may be a molded plastic component that attaches to the inside face of a FOUP door using the same features as the standard molded retainer. Whereas the standard plastic cushion uses cantilever or bridge-like features to apply a small load to the substrate edge, the disclosed substrate retainers do not have these cantilever or bridge-like features for applying a load directly to the substrate. Instead, the mounting structures are designed for supporting a foam, rubber, or elastomer insert for the purpose of cushioning the substrate edge. The mounting structures retain a consumable foam, rubber, or elastomer cushion without the use of adhesives or tape by using features that retain the peripheral portion of the insert or a pin and socket connection with or without a barb. In some embodiments, the cushion is over-molded onto the mounting structure. In other embodiments, the peripheral portion of the cushion may be formed with a full-length barb that is retained by a slot or groove cut through the mounting structure. The disclosed mounting structures accommodate simplified assembly and removal of the foam, rubber, or elastomer retainer cushion for washing operations and for periodic replacement.

In some embodiments, the door is configured with the necessary mounting features such as hooks, posts, or slots to directly attach the retainer cushion without the need of an intermediate mounting structure.

In one illustrative embodiment, a substrate retainer for a substrate container comprises a retainer cushion including a body portion having a thickness defining a thickness dimension. The body portion includes a compliant material that is compressible in the thickness dimension. A mounting structure is configured to secure the retainer cushion without use of an adhesive. In some embodiments, the compliant material is one of a foam material, rubber material or an elastomeric material. The mounting structure may be configured to mount to a door of the substrate container, the substrate container being a FOUP.

In various embodiments, the mounting structure is configured to secure the retainer cushion by compression of an overall dimension of the body portion, the mounting structure exerting a reactive force in response to compression of the overall dimension to retain the retainer cushion within the mounting structure, the mounting structure being configured to mount to the substrate container. In some embodiments, the mounting structure defines a recess, the retainer cushion being disposed in the recess.

In some embodiments, the overall dimension that is compressed is a lateral dimension orthogonal to the thickness dimension. Compression of the lateral dimension may bow the body portion to define a curvature of the body portion in a direction of the thickness dimension. In some embodiments, the recess of the mounting structure configured to accommodate the curvature of the body portion. The mounting structure may further include at least one lateral protrusion that defines a minimum lateral dimension of the recess. In some embodiments, the mounting structure includes latch arms configured for coupling the mounting structure to a standard FOUP door.

In various embodiments of the disclosure, the mounting structure includes a frame having side members separated by a plurality of cross members, each cross member defining a mounting face, the retainer cushion being coupled to the mounting face of each of the plurality of cross members. The cross members extend laterally relative to the side members. The side members and the plurality of cross members may be unitary. Each of the plurality of cross members may be arcuate so that the mounting face is concave or convex. In some embodiments, mounting features extend from the frame for coupling the mounting structure to the substrate container. Axial members may bridge adjacent ones of the plurality of cross members.

In various embodiments of the disclosure, the plurality of cross members includes a plurality of projections, at least one of the plurality of projections being disposed on each of the plurality of cross members, the plurality of projections extending into or through the thickness of the body portion. The body portion of the retainer cushion may define a plurality of mounting holes, each being positioned on the body portion for mating with a corresponding one of the plurality of projections and each being dimensioned for a friction fit with the corresponding one of the plurality of projections. In some embodiments, the mounting holes pass through the thickness of the body portion.

In various embodiments of the disclosure, a plurality of projections extends from a face of the body portion in a direction of the thickness dimension, wherein the plurality of cross members defines a plurality of apertures. At least one of the plurality of apertures is defined by each of the plurality of cross members, and each of the projections is sized and positioned on the body portion to mate with said plurality of apertures. The plurality of projections and the plurality of apertures may be dimensioned for a friction fit there between to secure the retainer cushion to the mounting structure. In some embodiments, each of the plurality of projections includes a neck portion and a bulbous portion distal to the neck portion, the neck portion being disposed in a corresponding one of the plurality of apertures, the bulbous portion being registered against a second face of the corresponding one of the plurality of cross members to secure the retainer cushion to the cross member, the second face being opposed to the mounting face of the corresponding one of the plurality of cross members. The projections and the body portion may be unitary.

The preceding summary is provided to facilitate an understanding of some of the innovative features unique to the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various illustrative embodiments in connection with the accompanying drawings, in which:

FIG. 1 depicts interaction of substrates with a conventional retainer.

FIG. 2A is a side elevational cross-sectional view of a front opening unified pod (FOUP) according to an embodiment of the disclosure.

Figure 3:
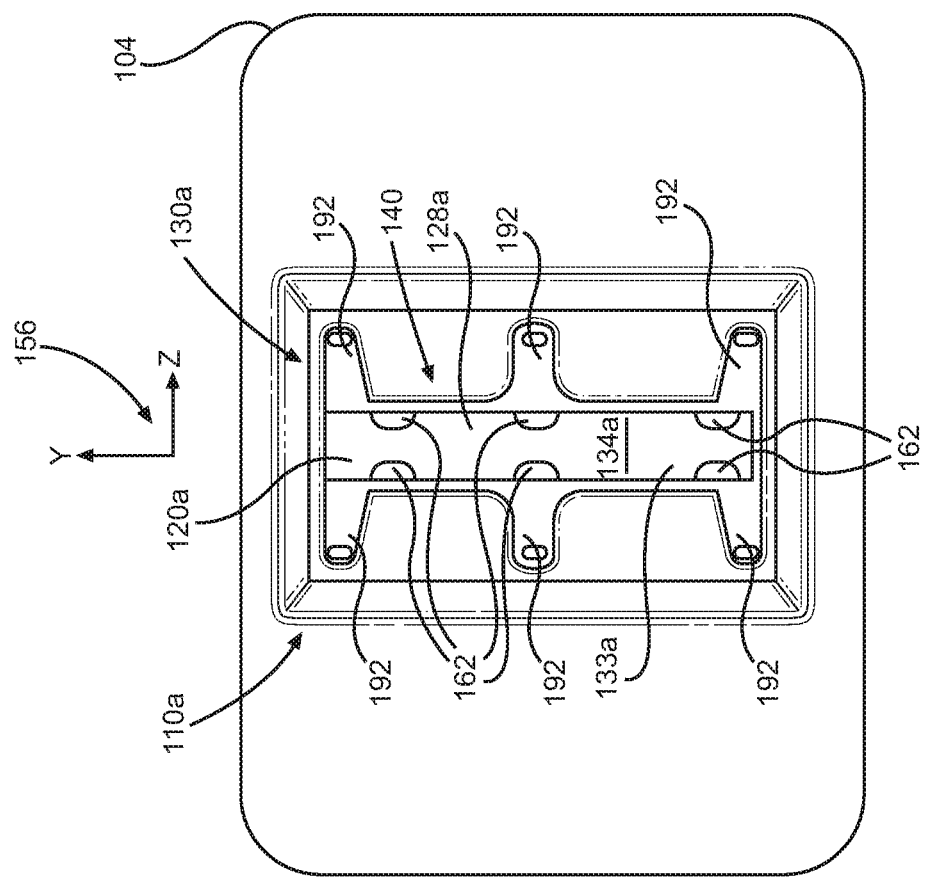
FIG. 3 is a frontal view of a FOUP door with a substrate retainer according to an embodiment of the disclosure.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DESCRIPTION

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The following detailed description should be read with reference to the drawings in which similar elements in different drawings are numbered the same. The detailed description and the drawings, which are not necessarily to scale, depict illustrative embodiments and are not intended to limit the scope of the disclosure. The illustrative embodiments depicted are intended only as exemplary. Selected features of any illustrative embodiment may be incorporated into an additional embodiment unless clearly stated to the contrary.

Referring to FIG. 2A, a substrate container 100 is depicted in an embodiment of the disclosure. The substrate container 100 includes a shell portion 102 defining an opening 103, and a door 104 configured to form a closer of the opening 103. A substrate retainer 110 is mounted on an interior face 106 of the door 104 for contacting leading or forward edges 112 of resident substrates 114 stored within the substrate container 100, the resident substrates 114 being substantially centered about a central axis 116. In the depiction of FIG. 2A, the forward edges 112 are depicted as being non-uniformly spaced in an axial direction 118 parallel to the central axis 116.

The substrate retainer 110 includes a retainer cushion 120 supported by a mounting structure 130. The retainer cushion 120 includes a body portion 122 having a thickness 124 that defines a thickness dimension. The body portion 122 is made of a compliant material that is compressible in the thickness dimension. Furthermore, the retainer cushion 120 is mechanically retained at an outer peripheral portion 133 by the mounting structure 130, so that adhesives or tape are not required to secure the body portion 122 to the substrate container 100. In the depicted embodiment, the mounting structure 130 is configured to mount to the door 104.

Figure 2B:
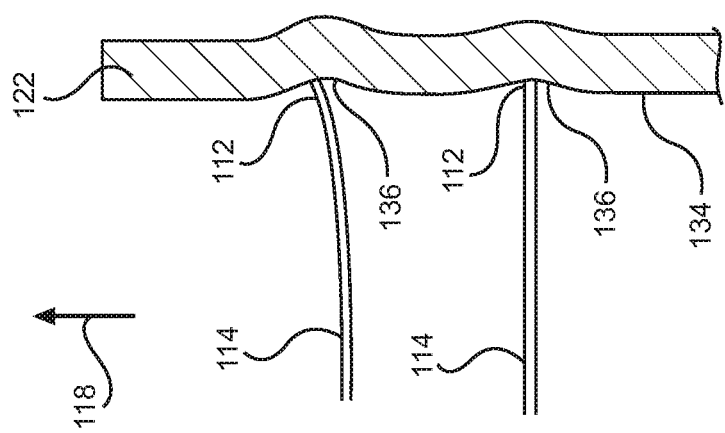
FIG. 2B is a cross-sectional view of a retainer cushion engaged with resident wafers according to an embodiment of the disclosure.

Referring to FIG. 2B, interaction of substrates 114 with a central region 134 of the retainer cushion 120 is depicted in an embodiment of the disclosure. Grooves and depressions are formed by interaction with the edges 112 of the resident substrates 114. Accordingly, the foam, rubber or elastomer material compresses and acts to define custom fit recesses 136 that provide retention of the forward edges 112 of the resident substrates in the axial direction 118. The recesses 136 are easily formed because central region 134 of the retainer cushion 120 is allowed to deflect away from the substrates 114 in addition to being compressed. Because of the elasticity of the retainer cushion, the recesses dissipate upon disengagement of the substrates 114.

The compliant material of the body portion 122 may be a foam material, rubber material or an elastomeric material. Non-limiting examples of compliant material include a polyurethane or polyethylene. Compliant materials may also include fluoroelastomers (FKM), silicone, ethyl propylene diene monomer (EPDM), urethane, nitrile rubber (NBR), and neoprene. Injection moldable thermoplastic elastomers may also be implemented for the compliant material, including thermoplastic polyolefin elastomers (TEOs), thermoplastic polyurethane, copolyesther-ester elastomers, and polyether block amide thermoplastic elastomer. In some embodiments, the compliant material is electrostatic dissipative, for example by carbon loading.

In various embodiments, the hardness of the compliant material may be in the range of 50 to 90 Shore A inclusive. In some embodiments, the hardness is in the range of 50 to 60 Shore A inclusive. In some embodiments, the hardness is in the range of 80 to 90 Shore A inclusive. Herein, a range that is said to be "inclusive" includes the end point values of the stated range as well as all values between the end points.

Functionally, the retainer cushion 120 of the substrate retainer 110 presents a substantially uniform contact face 128 that can accommodate a large variation in the axial spacing between the forward edges 112 of the resident substrates 114. The uniform contact face 128 eliminates the prospect of resident substrates 114 being damaged by or becoming inadvertently pinched within the substrate retainer 110. Furthermore, by not implementing adhesives or tape in mounting of the retainer cushion 120, there is no attendant out gassing of volatile organic compounds (VOCs) to contaminate the microenvironment. The retainer cushion 120 can also be readily removed during washing of the substrate container 100.

The depicted embodiment of FIG. 2A presents a FOUP-type container. It is noted that the embodiments and concepts depicted herein are applicable to any substrate container involving contact with an edge of a substrate or substrates for substrate retention and cushioning, including but not limited to front opening shipping boxes (FOSBs) and standard mechanical interface (SMIF) pods. Also, the substrate container of FIG. 2A depicts the substrate retainer 110 as being mounted to the door 104. Embodiments where the substrate retainer 110 is implemented at other locations within the substrate container (e.g., mounted to a rear wall 132) are also contemplated.

Herein, a "substrate" is a structure that is of substantially uniform thickness and, when properly supported, is substantially planar or intended to be substantially planar. Substrate forms include sheets, plates, or slabs. Substrates may be of any shape, including circular, rectangular, and polygonal. Substrates may be of a homogenous material, such as glass, silicon, or glass epoxy. Substrates may also include a composition of materials, such as doped materials (e.g., glass epoxy doped with copper or carbon), laminated composites (e.g., copper-cladded epoxy), or core materials with coatings deposited thereon. Substrates also include reticles used in lithography applications and silicon wafers that have been processed or partially processed by lithography techniques.

Herein, substrate retainers 110 are referred to generically or collectively by numerical reference 110, and individually by numerical reference 110 followed by a letter suffix (e.g., 110a). Similarly, retainer cushions 120 and mounting structures 130 are referred to generically or collectively by numerical references 120, and 130, respectively, and individually by numerical references 120 and 130, respectively, followed by a letter suffix (e.g., 120a and 130a).

Figure 4:
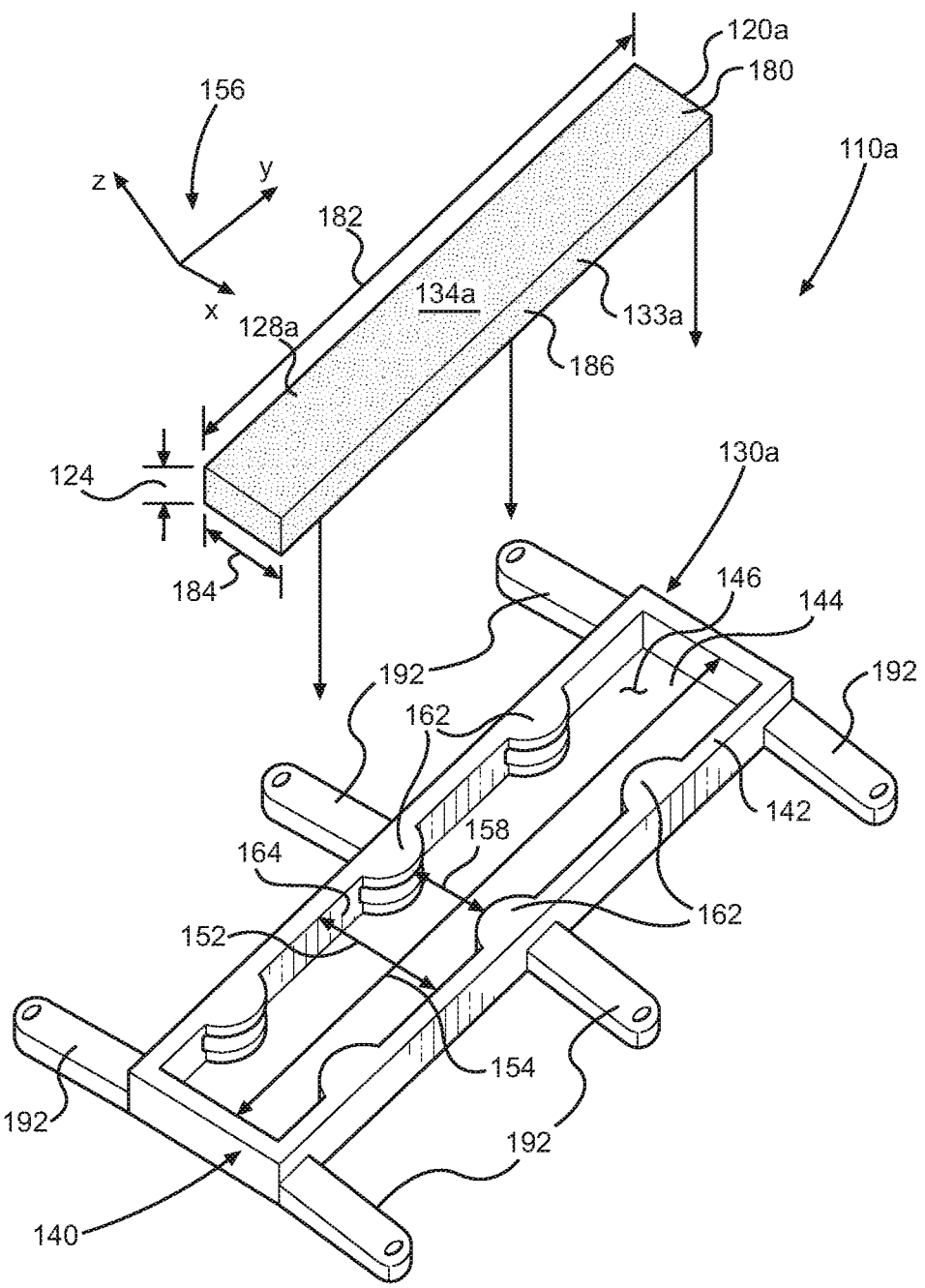
FIG. 4 is a perspective view of the substrate retainer of FIG. 3 in assembly according to an embodiment of the disclosure.
Figure 5:
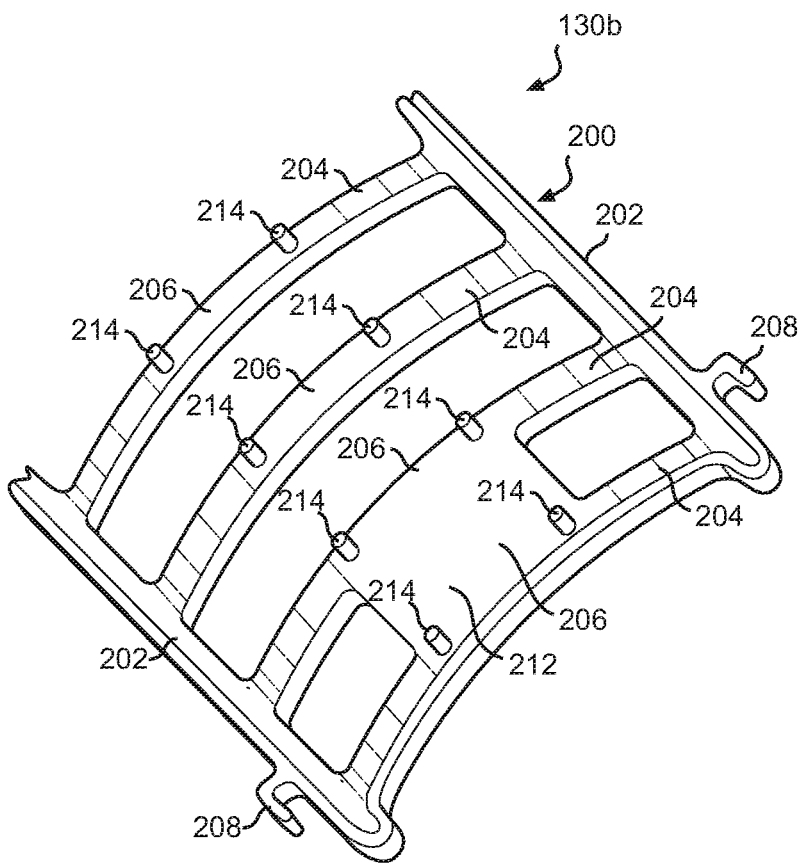
FIG. 5 is perspective view of a frame for supporting a retainer cushion according to an embodiment of the disclosure.
Figure 6:
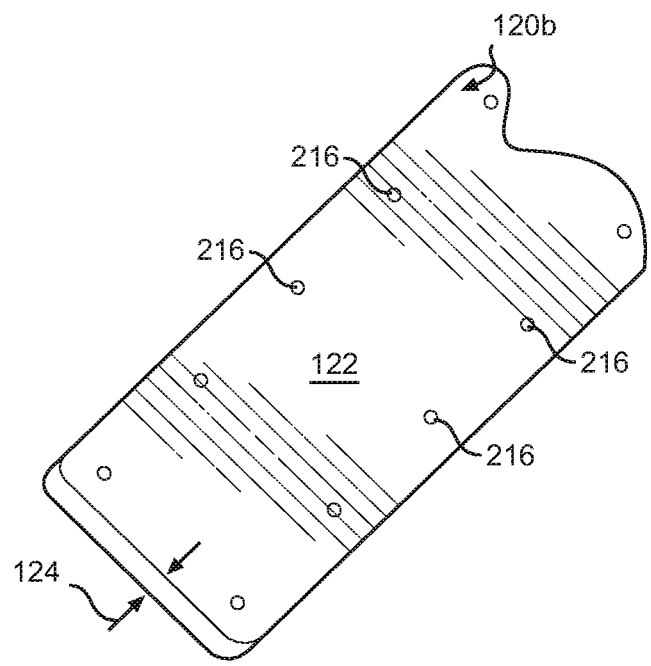
FIG. 6 is a partial perspective view of a retainer cushion for mounting to the frame of FIG. 5 according to an embodiment of the disclosure.
Figure 7:
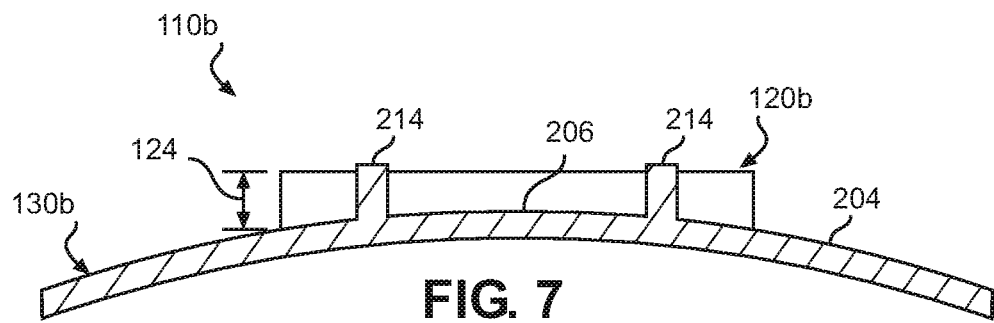
FIG. 7 is a partial, cross-sectional view of the retainer cushion of FIG. 6 mounted to the frame of FIG. 5 according to an embodiment of the disclosure.
Figure 8:
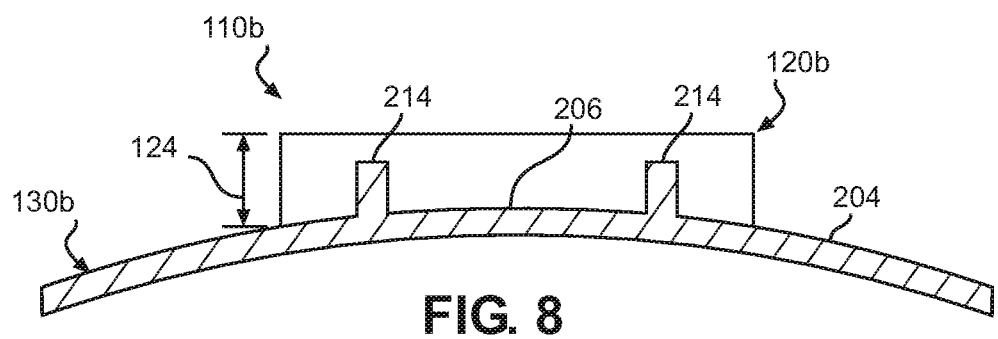
FIG. 8 is a partial, cross-sectional view of a retainer cushion with blind mounting holes coupled to a frame according to an embodiment of the disclosure.

Referring to FIGS. 3 and 4, a substrate retainer 110a including mounting structure 130a and retainer cushion 120a is depicted in an embodiment of the disclosure. In general terms, the mounting structure 130a is configured to secure the retainer cushion 120a at portion 133a by compression of an overall dimension of the body portion 122, the mounting structure 130a exerting a reactive force (e.g., friction or in response to bowing) in response to compression of the overall dimension to retain the retainer cushion 120a within the mounting structure 130a. Herein, an "overall dimension" refers to a total or maximum dimension in a given direction. For example, for a block-shaped body, the overall dimensions would be the height, the width, and the thickness.

In some embodiments, the mounting structure 130a includes a receptacle 140 having ridge portions 142 that extend from a base portion 144, the ridge and base portions 142 and 144 cooperating to define a recess 146. The ridge portion 142 defines a lateral inside dimension 152 and an axial inside dimension 154. Herein, "lateral" refers to a direction parallel to the x-axis and "axial" refers to a direction parallel to the y-axis of a Cartesian coordinate 156 as depicted in FIGS. 3 and 4. The base portion 144 may be substantially planar, or, alternatively, arcuate to define a convex or a concave boundary of the recess 146. In some embodiments, at least one lateral protrusion 162 protrudes from an inner edge 164 of the ridge portion 142, defining a minimum lateral dimension 158 of the recess 146.

In the depicted embodiment, the mounting structure 130a is configured to accommodate a retainer cushion 120a having a block-shaped body 180 with a peripheral portion 133a and a central region 134a. The block-shaped body 180 defines a height or axial dimension 182, a width or lateral dimension 184, and a thickness or thickness dimension 124 (i.e., a dimension parallel to the z-axis of the Cartesian coordinate). In some embodiments, the lateral dimension 184 of the block-shaped body 180 is greater than the lateral inside dimension 152 of the recess 146, and/or the minimum lateral dimension 158 of the recess 146.

The mounting structure 130a may be configured to mount to the substrate container 100, for example, to the door 104 of the substrate container 100. In some embodiments, a plurality of arms 192 extend from the ridge portion of the receptacle 140. In various embodiments, the arms are configured to mate with features of existing substrate containers, e.g., attachment points for conventional substrate retainers on a FOUP door.

In assembly, the block-shaped body 180 of the retainer cushion 120a is inserted into the receptacle 140. Because the lateral dimension 184 of the block-shaped body 180 is oversized relative to the lateral inside dimension 152 and/or the minimum lateral dimension 158 of the recess 146, there is an interference fit between the receptacle 140 and the peripheral portion 133a of the block-shaped body 180. The interference creates a friction fit between the receptacle 140 and the block-shaped body 180 that retains the block-shaped body 180 within the receptacle 140 but allows the central region 134a to deflect relative to the mounting structure 130a, when in use, to prevent damage to substrates 114.

In some embodiments, the resulting compression of the lateral dimension 184 of the retainer cushion 120a is such that the retainer cushion 120a is bowed to define a convexity in a direction of the thickness dimension 124. In some embodiments, the mounting structure 130a is configured to accommodate the convexity, for example by providing a gap (not depicted) between the block-shaped body 180 and the base portion 144, or by an arcuate base portion 144 that defines a convex boundary of the recess 146. In some embodiments, the bowing causes the central region 134a of the contact face 128a to bow outwards from the receptacle 140. Functionally, the ridge portion 142 of the receptacle 140 exerts a force against a perimeter 186 of the block-shaped body 180 that helps retain the block-shaped body 180 within the receptacle 140.

Referring to FIGS. 5 through 8, a mounting structure 130b of a substrate retainer 110b and corresponding retainer cushion 120b are depicted in an embodiment of the disclosure. The mounting structure 130b includes a frame 200 having side members 202 separated by a plurality of cross members 204, each cross member 204 defining a mounting face 206. The retainer cushion 120b is coupled to the mounting face 206 of each of the plurality of cross members 204. In some embodiments, the side members 202 and the plurality of cross members 204 are unitary. In various embodiments, each of the plurality of cross members 204 are arcuate so that the mounting faces 206 are convex. In the depicted embodiment, the mounting structure 130b includes mounting features 208 that extend from the frame 200 for coupling the mounting structure 130b to the substrate container 100. The mounting structure 130b may include axial members 212 that bridge adjacent ones of the plurality of cross members 204.

In various embodiments, the plurality of cross members 204 includes a plurality of projections 214. At least one of the plurality of projections 214 is disposed on each of the plurality of cross members 204. The plurality of projections 214 extends through (FIG. 7) or into (FIG. 8) the thickness 124 of the body portion 122. The body portion 122 of the retainer cushion 120b may define a plurality of mounting holes or apertures 216 (FIG. 6), each being positioned on the body portion 122 for mating with a corresponding one of the plurality of projections 214 and each being dimensioned for a friction fit with the corresponding one of the plurality of projections 214.

Figure 9:
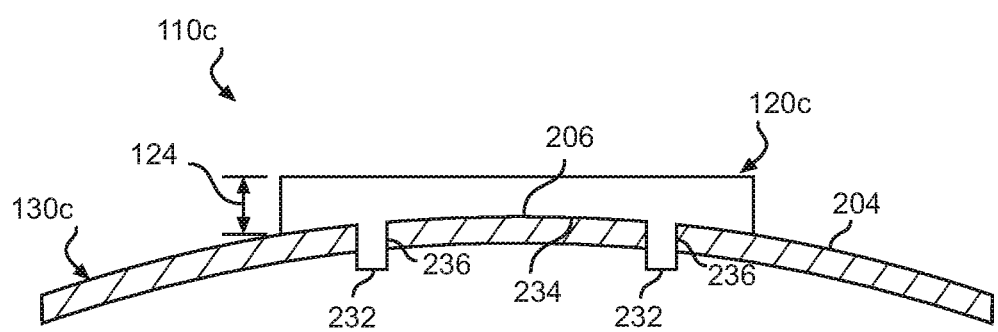
FIG. 9 is a partial, cross-sectional view of a retainer cushion with cylindrical projections mounted to a frame according to an embodiment of the disclosure.
Figure 10:
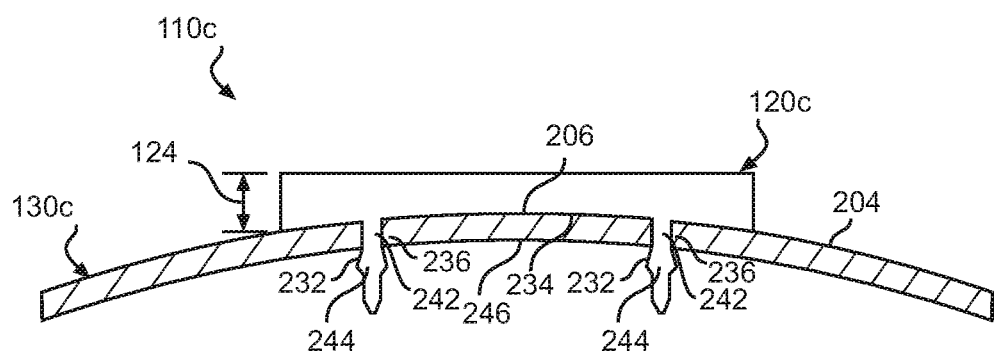
FIG. 10 is a partial, cross-sectional view of a retainer cushion with bulbous projections mounted to a frame according to an embodiment of the disclosure.

Referring to FIGS. 9 and 10, a substrate retainer 110c including a mounting structure 130c and retainer cushion 120c is depicted in an embodiment of the disclosure. The mounting structure 130c may be of the same general form as described for the mounting structure 130b and include the same components and attributes as the mounting structure 130b. A difference between the mounting structures 130b and 130c is that the mounting structure 130c includes female mounting features (e.g., apertures 236) instead of male mounting features (e.g., projections 214).

In the depicted embodiment, a plurality of projections 232 extends from a mounting face 234 of the body portion 122 in a direction of the thickness dimension 124. The plurality of cross members 204 defines a plurality of apertures 236. In some embodiments, at least one of the plurality of apertures 236 is defined by each of the plurality of cross members 204. In one embodiment, the plurality of projections 232 of the retainer cushion 120c and the plurality of apertures 236 of the cross members 204 are dimensioned for a friction fit there between to secure the retainer cushion 120c to the mounting structure 130c (FIG. 9). The projections 232 and the body portion 122 may be unitary.

In some embodiments, each of the plurality of projections 232 of the retainer cushion 120c includes a neck portion 242 and a bulbous portion 244 distal to the neck portion 242, the neck portion 242 being disposed in a corresponding one of the plurality of apertures 236. The bulbous portion 244 of a given projection may register against a second face 246 of the cross member 204 to secure the retainer cushion 120c to the cross member 204. The second face 246 of a given cross member 204 is opposed to the mounting face 206.

Figure 11:
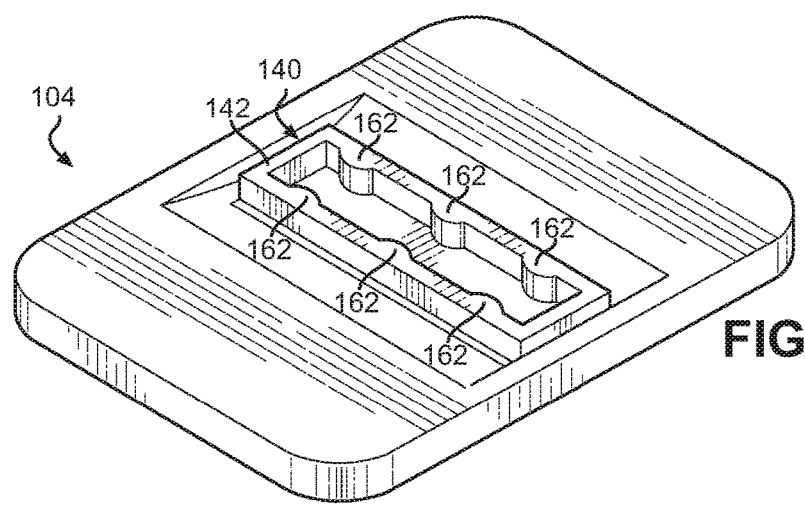
FIG. 11 is a perspective view of a FOUP door with a receptacle mounting structure integral therewith according to an embodiment of the disclosure.
Figure 12:
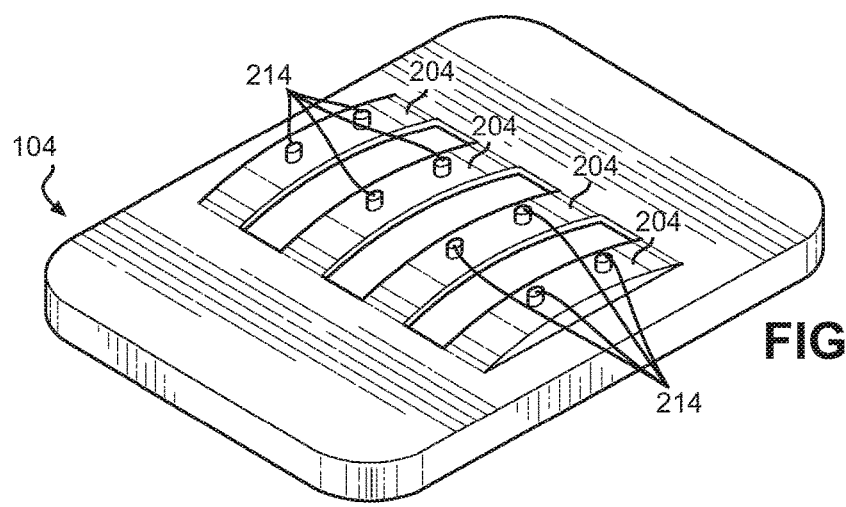
FIG. 12 is a perspective view of a FOUP door having a mounting structure integral therewith, the mounting structure including cross members having projections thereon, according to an embodiment of the disclosure.
Figure 13:
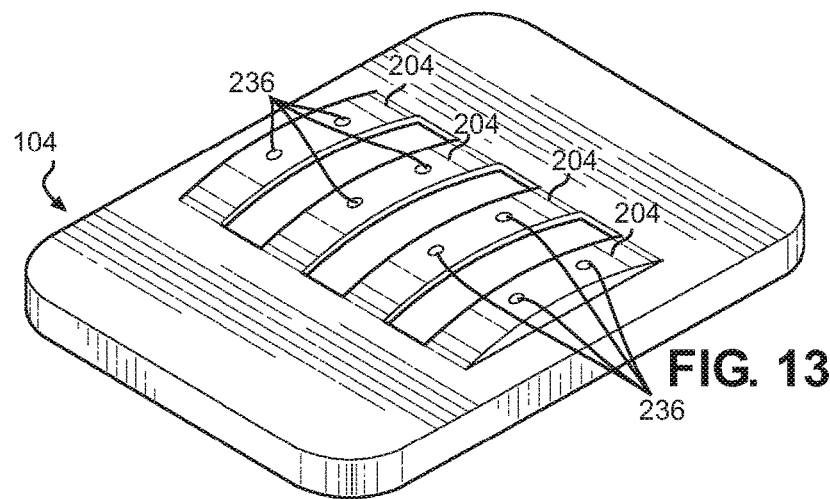
FIG. 13 is a perspective view of a FOUP door having a mounting structure integral therewith, the mounting structure including cross members having apertures, according to an embodiment of the disclosure.

Referring to FIGS. 11 through 13, the door 104 of the substrate container is modified to accommodate a given one of the disclosed retainer cushions directly according to embodiments of the disclosure. For example, the door 104 may include the receptacle 140 of the mounting structure 130a integral therewith (FIG. 11), the cross members 204 and projections 214 of the mounting structure 130b integral therewith (FIG. 12), or the cross members 204 and apertures 236 of the mounting structure 130c integral therewith (FIG. 13). The corresponding retainer cushion 120a, 120b, or 120c could then be coupled to the door 104 directly, without need of the intermediate mounting structure 130. In various embodiments, the mounting structures 130 are formed integrally with the door 104, for example by an injection molding process. In other embodiments, the components are formed separately and made integral by, for example, a welding, bonding, or fusion process.

Figure 14:
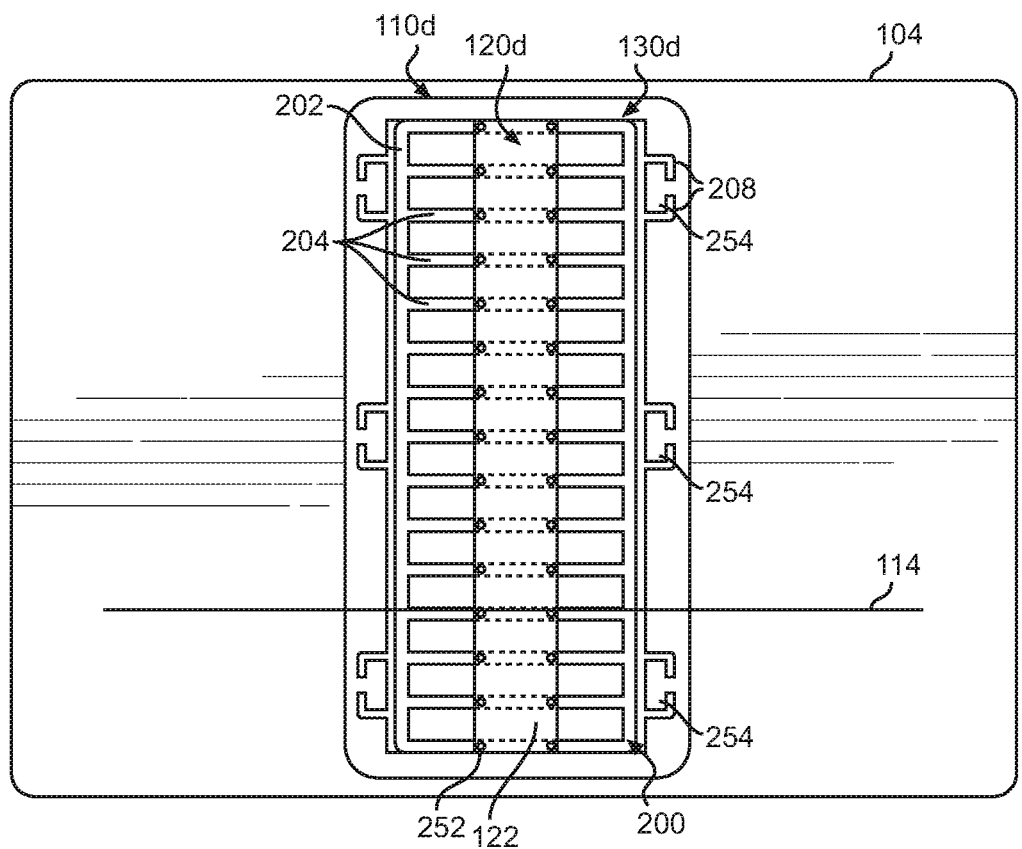
FIG. 14 is a frontal view of a FOUP door with a substrate retainer according to an embodiment of the disclosure.
Figure 15:
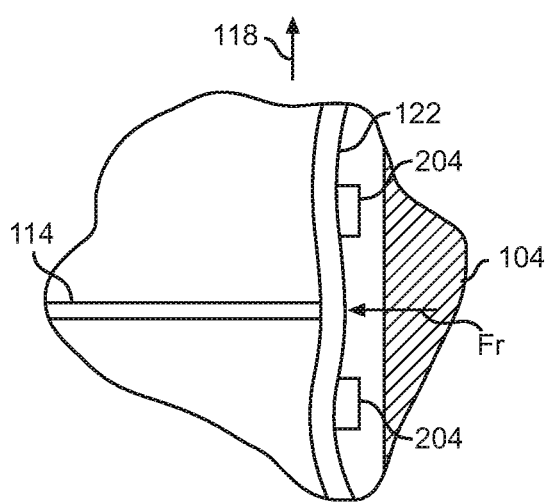
FIG. 15 is a partial, cross-sectional view of a wafer engaged with the substrate retainer of FIG. 14 according to an embodiment of the disclosure.

Referring to FIGS. 14 and 15, a substrate retainer 110d including a mounting structure 130d and retainer cushion 120d is depicted in an embodiment of the disclosure. Like the mounting structures 130b and 130c, the mounting structure 130d includes side members 202 separated by cross members 204. Also like the mounting structures 130b and 130c, the mounting structure 130d and retainer cushion 120d may include complementary mounting features 252 (e.g., projections 214 and apertures 216 of FIGS. 7 and 8, or apertures 236 and projections 232 of FIGS. 9 and 10) on the cross members 204 and retainer cushion 120d for securing the retainer cushion 120d to the cross members 204. Furthermore, the mounting structure 130d may also include mounting features 208 for coupling the mounting structure 130d to the substrate container 100. In the depicted embodiment, the mounting features 208 are hook-shaped for mating with retaining structures 254 that project from an inside face of the door 104.

For the mounting structure 130d and retainer cushion 120d, the retention force exerted on a resident substrate 114 is primarily by stretching displacement of the retainer cushion 120d in the axial direction 118. The axial stretching pulls the retainer cushion 120d taut, so that the retainer cushion 120d acts as a stretched diaphragm that exerts a radial force Fr on the substrate 114. This is in contrast to the mounting structures 130a, 130b, and 130c and retainer cushions 120a, 120b, and 120c, for which the primary retention force is reaction to an elastic compression and for which acting as a stretched diaphragm provides a secondary retention force. In various embodiments, the cross members 204 are dimensioned to readily deflect on the chance that a resident substrate 114 is directly aligned therewith so that the retainer cushion 120d can deflect and between the cross members 204 there is space for the retainer cushion 120d to deflect when the resident substrates 114 are not aligned with one of the cross members 204.

Figure 16:
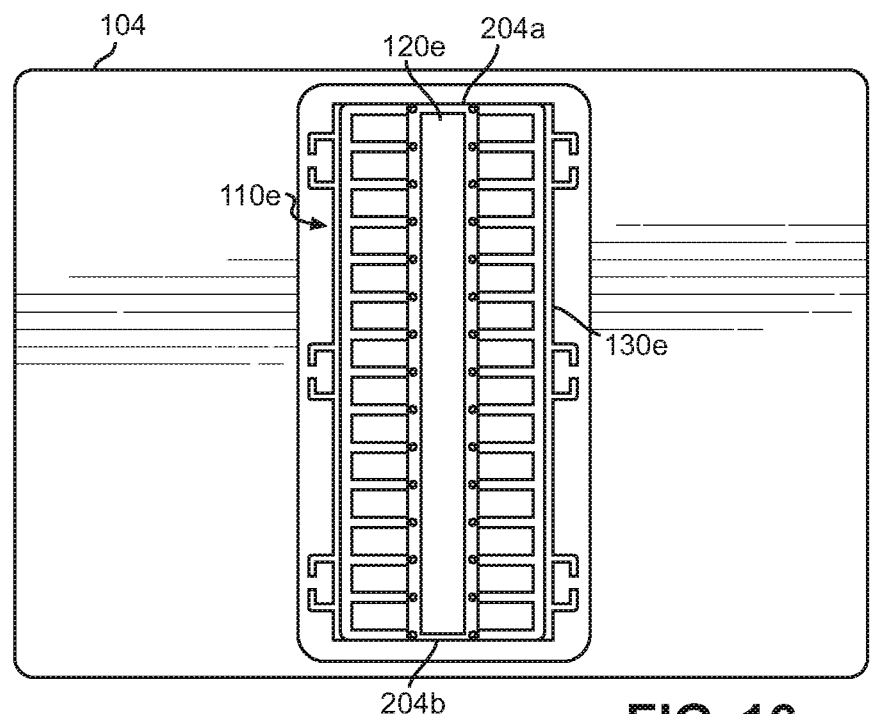
FIG. 16 is a frontal view of a FOUP door with a substrate retainer according to an embodiment of the disclosure.
Figure 17:
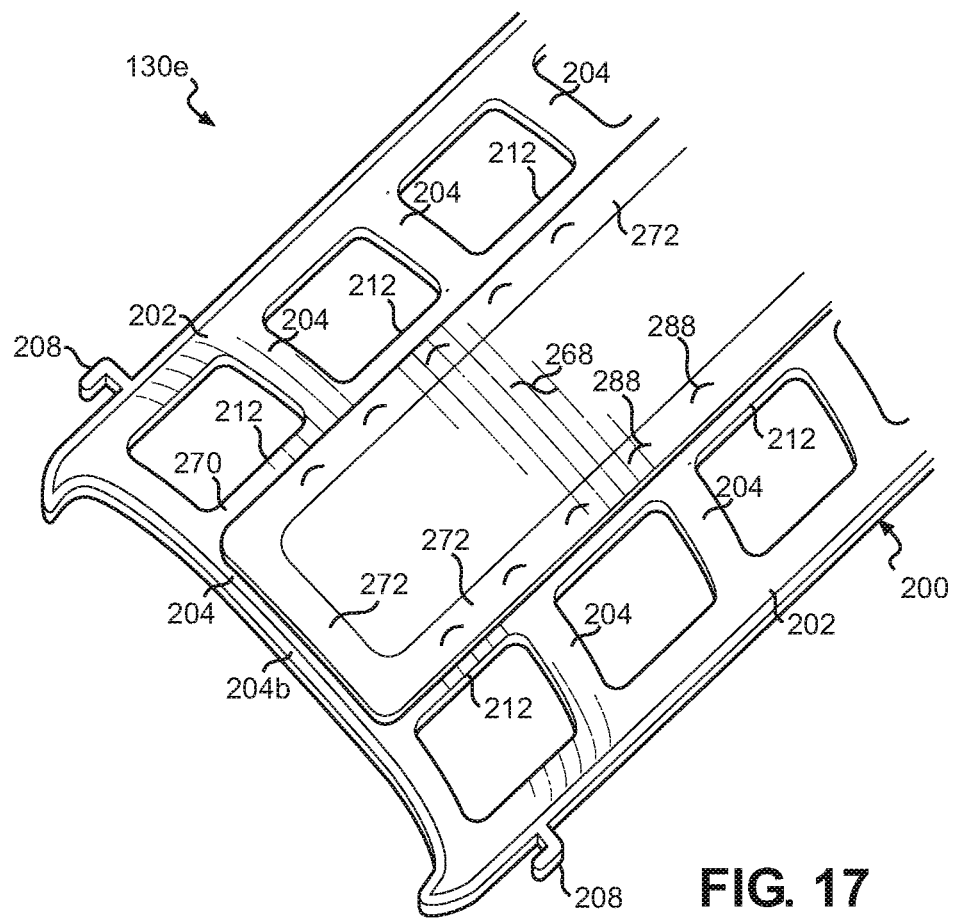
FIG. 17 is a perspective view of a frame for supporting a retainer cushion according to an embodiment of the disclosure.
Figure 18:
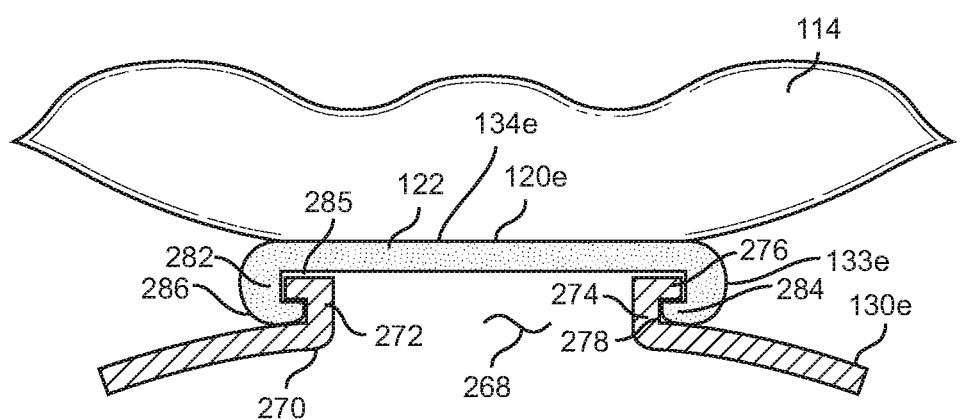
FIG. 18 is a partial, cross-sectional view of a retainer cushion mounted to the frame of FIG. 17 according to an embodiment of the disclosure.

Referring to FIGS. 16 through 18, a substrate retainer 110e including a mounting structure 130e and retainer cushion 120e is depicted in an embodiment of the disclosure. Like the mounting structure 130b, the mounting structure 130e includes a frame 200 having side members 202 separated by cross members 204, and axial members 212 that bridge adjacent cross members 204. Also like the mounting structure 130b, the mounting structure 130e may include mounting features 208 extending therefrom.

Unlike the mounting structure 130b, not all the cross members 204 separate or bridge the side members 202. Rather, only a first cross member 204a and a second cross member 204b of the plurality of cross members 204 separate or bridge the side members 202. In the depicted embodiment, the first and second cross members 204a and 204b are the uppermost and the lowermost of the plurality of cross members 204. Also in the depicted embodiment, the axial members 212 are aligned and cooperate with the first and second cross members 204a and 204b to define an inner frame 270. In some embodiments, a flange structure 272 extends from the inner frame 270, the flange structure defining a central opening 268. The flange structure includes a standoff portion 274 and a lateral portion 276 and cooperates with the inner frame 270 to define an undercut 278.

The retainer cushion 120e is configured to couple with and bridge the flange structure 272. As with the other disclosed retainer cushions 120, the retainer cushion 120e includes a body portion 122 made of a compliant material. The retainer cushion 120e also includes opposed rail portions 282 that extend from the body portion 122. Alternatively, the retainer cushion includes a continuous rail portion 282 having opposing sides. Each rail portion 282 includes a lip 284 that extends under the body portion 122 and is configured to mate within the undercut 278. The lip 284 and body portion 122 cooperate to define a slot 285. In the depicted embodiment, the rail portion 282 defines a periphery 286 of the edge portion 133e. Also in the depicted embodiment, the body portion 122 of the retainer cushion 120e has a central region 134e that spans the opening 268 without additional support. Alternatively, support structures (not depicted) such as bands, ligaments, and/or mesh structures can bridge the opening 268 to provide additional resilient support to the body portion 122 of the retainer cushion 120e. In some embodiments, the rail portion 282 is continuous, surrounding the body portion 122; in other embodiments, two rail portions 282 extend only along opposing edges of the body portion 122.

In assembly, the rail portion(s) 282 of the retainer cushion 120e are coupled to the flange structure 272 to cover the opening 268. For configurations where the rail portion 282 surrounds or substantially surrounds the body portion 122, the retainer cushion 120e snaps over the flange structure 272 of the mounting structure 130e, effectively forming a cap over the flange structure 272. To remove the retainer cushion 120e, for example prior to a washing process, the rail portion 282 is lifted or peeled away from the flange structure 272.

For configurations where the retainer cushion 120e includes two separate and opposing rail portions 282, the retainer cushion 120e can be slid over the flange structure 272 from one end. The flange structure 272 may include protrusions 288 that increase the interference between the lateral portion 276 of the flange structure 272 and the slot 285 formed by the rail portion 282 of the retainer cushion 120e. The increased interference may help in securing the retainer cushion 120e to the flange structure 272. To remove the retainer cushion 120e, the retainer cushion 120e is slid off the lateral portions 276 of the flange structure 272.

In operation, the body 122 of the retainer cushion 120e engages the edges of the resident substrates 114. In some embodiments, the compliant material of the body portion 122 of the retainer cushion 120e is of an elastic foam material, relying on compression of the foam to exert a radial force on the resident substrates. In other embodiments, the compliant material is an elastomeric material that stretches, akin to the retainer cushion 120d, that becomes taut upon engagement with the resident substrates 114 to exert the substrate retention force. The embodiments are not mutually exclusive such that the embodiments may rely on compression of the foam and stretched elastomeric material to exert the substrate retention force.

The use of a composite retainer cushion 120e is also contemplated, wherein the body portion 122 includes an elastomeric base with an elastic foam material disposed over the face for contact with the resident substrates 114. The elastic foam material may be joined to the elastomeric base by adhesive-free techniques, for example fusion, welding, or overmolding.

Figure 19:
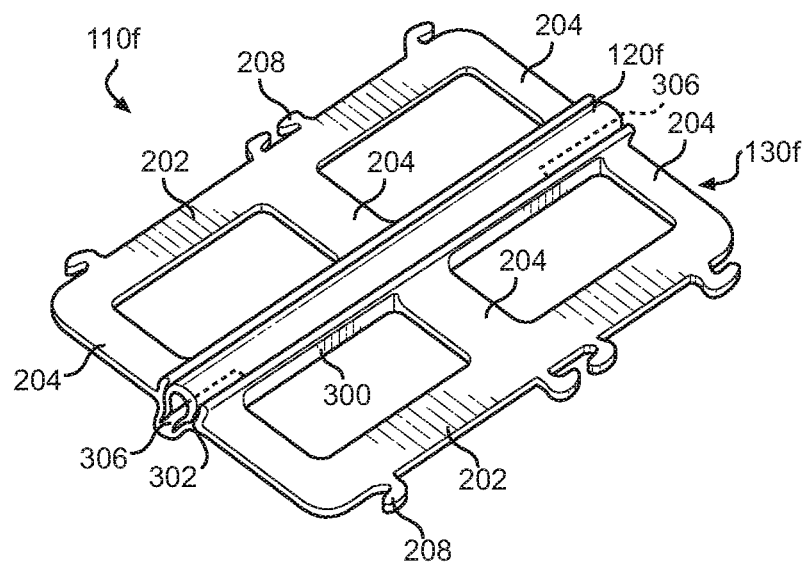
FIG. 19 is a perspective view of a substrate retainer according to an embodiment of the disclosure.

Referring to FIG. 19, a substrate retainer 110f including a mounting structure 130f and retainer cushion 120f is depicted in an embodiment of the disclosure. Like the mounting structures 130b through 130e, the mounting structure 130f includes side members 202 separated by cross members 204, and may include mounting features 208. The mounting structure 130f also includes a central axial member 300 supported by the cross members 204. The central axial member 300 defines a channel 302 that extends axially. The retainer cushion 120f is disposed within the channel 302.

In the depicted embodiment, the retainer cushion 120f is circular-tubular, and the channel 302 defines an arcuate or semi-circular surface to conform to the circular-tubular form. The mounting structure 130f may include clips 306 disposed at opposing ends of the channel 302 that secure the retainer cushion 120f to the mounting structure 130f. The retainer cushion 120f may be formed from a foam tube or a hollow O-ring cord stock.

In operation, the retainer cushion 120f projects from the mounting structure 130f to contact the wafers, akin to the retainer cushion 120a of the substrate retainer 110a.

Figure 20:
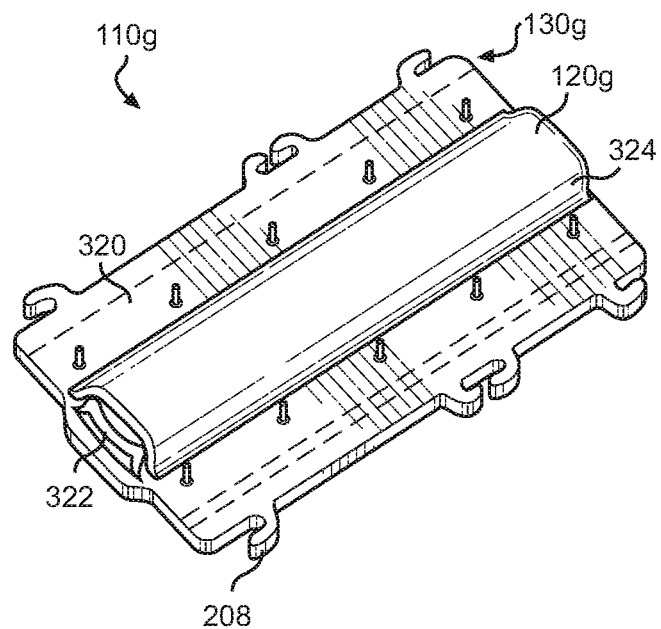
FIG. 20 is a perspective view of a substrate retainer according to an embodiment of the disclosure.

Referring to FIG. 20, a substrate retainer 110g including a mounting structure 130g and retainer cushion 120g is depicted in an embodiment of the disclosure. The mounting structure 130g includes a mounting plate 320 and, like the mounting structures 130b through 130f, may include mounting features 208. A mounting rail 322 extends axially along the center of the mounting plate 320. The retainer cushion 120g is arcuate shaped and coupled to the mounting rail 322. In one embodiment, the retainer cushion 120g includes an arch-shaped sheet cushion 324 formed by slitting and unfurling a cylindrical tube. The unfurled cylindrical tube acts to pre-load the arch-shaped sheet cushion 324 against the rail 322.

In operation, the retainer cushion 120g projects from the mounting structure 130g to contact the wafers, akin to the retainer cushion 120a of the substrate retainer 110a.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respect, only illustrative. Changes may be made in details, particularly in matters of shape, size, and arrangement of parts without exceeding the scope of the disclosure. The disclosure's scope is, of course, defined in the language in which the appended claims are expressed.

What is claimed is:

1. A substrate retainer for a substrate container, comprising:
    a retainer cushion including a body portion having an outer peripheral portion, a central region and a thickness defining a thickness dimension, the body portion being formed of a compliant material that is compressible in the thickness dimension; and
    a mounting structure configured to secure the retainer cushion at the outer peripheral portion and to allow the central region to deflect relative to the mounting structure,
    wherein the mounting structure is configured to secure the retainer cushion by compression of an overall dimension of the body portion, the mounting structure exerting a reactive force in response to compression of the overall dimension to retain the retainer cushion within the mounting structure without the use of adhesive, the mounting structure being configured to mount to the substrate container.

2. The substrate retainer of claim 1, wherein the compliant material is able to both compress and to deflect when pressure is applied to the central region and is formed of one of a foam material, a rubber material or an elastomeric material.

3. The substrate retainer of claim 2, further comprising, in combination, a substrate container for housing substrates, wherein the mounting structure is configured to mount to a door of the substrate container, with the retainer cushion having a first side configured to engage the substrates and an opposite side, facing the door and spaced from the mounting structure, whereby the mounting structure is configured to allow the central region to deflect in order to prevent damage to the substrates.

4. The substrate retainer of claim 1, wherein the mounting structure defines a recess, the retainer cushion being disposed in the recess.

5. The substrate retainer of claim 4, wherein the overall dimension is a lateral dimension orthogonal to the thickness dimension.

6. The substrate retainer of claim 5, wherein compression of the lateral dimension bows the body portion to define a curvature in a direction of the thickness dimension, the recess of the mounting structure configured to accommodate the curvature.

7. The substrate retainer of claim 5, wherein the mounting structure includes at least one lateral protrusion that defines a minimum lateral dimension of the recess.

8. A substrate retainer for a substrate container, comprising:
    a retainer cushion including a body portion having an outer peripheral portion, a central region and a thickness defining a thickness dimension, the body portion being formed of a compliant material that is compressible in the thickness dimension; and
    a mounting structure configured to secure the retainer cushion at the outer peripheral portion and to allow the central region to deflect relative to the mounting structure, wherein the mounting structure includes a frame having side members separated by a plurality of unitary cross members, each cross member defining a mounting face, the retainer cushion being coupled to the mounting face of each of the plurality of cross members.

9. The substrate retainer of claim 8, wherein each of the plurality of cross members is arcuate so that the mounting face is concave or convex.

10. The substrate retainer of claim 8, comprising mounting features extending from the frame for coupling the mounting structure to the substrate container.

11. The substrate retainer of claim 8, comprising axial members that bridge adjacent ones of the plurality of cross members.

12. The substrate retainer of claim 8, wherein the plurality of cross members includes a plurality of projections, at least one of the plurality of projections being disposed on a corresponding one of the plurality of cross members, the plurality of projections extending into or through the thickness of the body portion.

13. The substrate retainer of claim 12, wherein the body portion of the retainer cushion defines a plurality of mounting holes passing through the thickness of the body portion, each hole being positioned on the body portion for mating with a corresponding one of the plurality of projections and each being dimensioned for a friction fit with the corresponding one of the plurality of projections.

14. The substrate retainer of claim 8, comprising a plurality of projections that extend from a face of the body portion in a direction of the thickness dimension, wherein the plurality of cross members defines a plurality of apertures, at least one of the plurality of apertures being defined by each of the plurality of cross members, and wherein each of the projections is sized and positioned on the body portion to mate with said plurality of apertures.

15. The substrate retainer of claim 14, wherein the plurality of projections and the plurality of apertures are dimensioned for a friction fit there between to secure the retainer cushion to the mounting structure and wherein the projections and the body portion are unitary.

16. The substrate retainer of claim 14, wherein each of the plurality of projections includes a neck portion and a bulbous portion distal to the neck portion, the neck portion being disposed in a corresponding one of the plurality of apertures, the bulbous portion being registered against a second face of the corresponding one of the plurality of cross members to secure the retainer cushion to the cross member, the second face being opposed to the mounting face of the corresponding one of the plurality of cross members.

17. A method of retaining substrates comprising:
    placing substrates in a substrate container including the retainer cushion of claim 1; and
    retaining the substrates by pressing a central region of the retainer cushion against the substrates while allowing the central region to deflect so as not to damage the substrates.

18. The method of claim 17, further comprising securing the cushion in a mounting structure at the outer peripheral portion of the cushion and bending the cushion into a curved configuration.

19. The method of claim 17, further comprising compressing the retainer cushion when pressing the central region of the retainer cushion against the substrates.

* * * * *